United States Patent [19]

Tanaka et al.

[11] Patent Number: 4,525,381
[45] Date of Patent: Jun. 25, 1985

[54] PHOTOCHEMICAL VAPOR DEPOSITION APPARATUS

[75] Inventors: Kazuya Tanaka; Shinji Sugioka, both of Kawasaki, Japan

[73] Assignee: Ushio Denki Kabushiki Kaisha, Tokyo, Japan

[21] Appl. No.: 566,790

[22] Filed: Dec. 29, 1983

[30] Foreign Application Priority Data

Feb. 9, 1983 [JP] Japan ................................ 58-18777
Feb. 9, 1983 [JP] Japan ................................ 58-18778

[51] Int. Cl.³ .................... B05D 3/06; C23C 13/08
[52] U.S. Cl. ...................... 427/54.1; 118/719; 118/723; 118/50.1; 427/38
[58] Field of Search ............. 427/54.1, 38, 39, 40, 427/41; 118/723, 50.1, 620, 719

[56] References Cited

U.S. PATENT DOCUMENTS

| | | | |
|---|---|---|---|
| 3,310,424 | 3/1967 | Wehner et al. | 427/54.1 |
| 4,158,589 | 6/1979 | Keller et al. | 156/345 |
| 4,277,304 | 7/1981 | Horiike et al. | 156/643 |
| 4,317,844 | 3/1982 | Carlson | 427/39 |
| 4,415,602 | 11/1983 | Brodie et al. | 427/40 |
| 4,454,835 | 6/1984 | Walsh et al. | 118/719 X |

OTHER PUBLICATIONS

Maissel et al., "Handbook of Thin Film Tech", McGraw Hill Bk. Co., New York, 1970, pp. 4–6 to 4–8.

*Primary Examiner*—John D. Smith
*Assistant Examiner*—Bernard F. Plantz
*Attorney, Agent, or Firm*—Ziems, Walter & Shannon

[57] ABSTRACT

In a photochemical vapor deposition apparatus, a reaction space in which a substrate is to be placed and a discharge space adjacent to the reaction space, in which electric plasma discharge is generated for radiating ultraviolet rays which cause photochemical decomposition reaction of a photoreactive gas, are surrounded by the same vessel, and discharging electrodes are provided in the discharge space so as to be opposite to each other in a first level and a second level, which are different in level in the direction in which the spaces align. The discharging electrode arranged in the first level, which is closer to the reaction space, has such a configuration or arrangement that an ultraviolet ray-passing opening is formed.

According to the apparatus, a vapor-deposited film can be formed with high efficiency, because a large quantity of ultraviolet rays can be applied to the substrate without any damage of the vapor-deposited film.

10 Claims, 4 Drawing Figures

PHOTOCHEMICAL VAPOR DEPOSITION APPARATUS

BACKGROUND OF THE INVENTION

1. Field of the Invention

This invention relates to a photochemical vapor deposition apparatus.

2. Description of the Prior Art

Recently, there are studied methods for forming a vapor-deposited film of amorphous silicon for use in the photosensitive drum of a duplicating machine or a solar cell. On the other hand, a vapor depositing method is further utilized in the formation of diverse insulating films or protective films, and a variety of vapor depositing methods have been proposed in answer to various uses. Among these methods, a photochemical vapor depositing method utilizing a photochemical reaction is being now particularly watched because of having such advantages that the film-deposition rate is remarkably high and a uniform film can be formed on a portion of large area of a substrate, too.

A conventional chemical vapor depositing method utilizing a photochemical reaction comprises placing a substrate in an air-tight vessel made of material through which ultraviolet rays can be fully transmitted, feeding a photoreactive gas to flow through the vessel and applying ultraviolet rays radiated from an ultraviolet discharge lamp outside of the vessel through the wall thereof onto the substrate so that a photochemical reaction is caused to decompose the photoreactive gas and the resulting reaction product is vapor-deposited onto the substrate. In spite of having the above-mentioned remarkable advantages, this conventional photochemical deposition method that may be called "outer discharge type", has however been found to have such a defect that the reaction product is also vapor-deposited on the inner wall of the vessel, with impeding the transmission of ultraviolet rays seriously.

Thus, a photochemical vapor deposition apparatus, that may be called "inner discharge type", has been studied and developed. In the apparatus of this type, a reaction space and a discharge space are air-tightly surrounded by the same one vessel. The reaction space forms a passage for a photoreactive gas and in this reaction space a substrate is to be placed. In the discharge space, electric plasma discharge is generated and ultraviolet rays radiated from the plasma are applied onto the substrate to cause a photochemical reaction of decomposition of the photoreactive gas. Between the plasma and the substrate, there is no partition member that impedes passing of the ultraviolet rays.

In the photochemical vapor deposition apparatus of an inner discharge type, a substrate is horizontally placed on the bottom of the vessel and discharging electrodes are arranged in such a state that they are opposite to each other in a horizontal direction with the discharge space therebetween, whereby plasma discharge is generated in the horizontal direction. Since the plasma of electric discharge generated between the electrodes diffuses or expands mainly in the direction perpendicular to the discharging direction, however, there is a fear that the diffused or expanded plasma will damage the vapor-deposited film on the substrate placed below. In order to prevent such damaging of the film, it is required that the substrate be placed at a position more remote from the plasma than the mean free path of ions or electrons in the plasma. On the other hand, in order to increase the intensity of ultraviolet rays applied onto the substrate to improve the efficiency of the vapor deposition, the substrate should be kept near an ultraviolet ray source as much as possible. After all, in the photochemical vapor deposition apparatus of an inner discharge type, vapor depositing with sufficiently high film-deposition rate is not carried out, because the applying efficiency of ultraviolet rays is lowered due to the placement of the substrate at a position remote enough from the ultraviolet ray source, namely the plasma of the discharge.

SUMMARY OF THE INVENTION

With the foregoing in view, an object of this invention is to provide a photochemical vapor deposition apparatus of an inner discharge type in which electric plasma discharge is generated without diffusing or expanding of the plasma in the direction of a substrate by a simple construction, thereby permitting a substrate to be placed at a position close enough to an ultraviolet ray source of plasma that a vapor-deposition can be carried out with high efficiency.

In accordance with this invention, there is provided a photochemical vapor deposition apparatus wherein a reaction space, in which a substrate for vapor deposition is to be placed, and a discharge space adjacent to the reaction space, in which electric plasma discharge is generated for radiating ultraviolet rays which cause a photochemical decomposition reaction of a photoreactive gas, are surrounded by the same vessel, and discharging electrodes are arranged in the discharge space in a first level and a second level, which are different in level in the direction in which the reaction space and the discharge space align so that they are opposite to each other, wherein the discharging electrode arranged in the first level which is closer to the reaction space, has such a configuration or arrangement that an opening for passing ultraviolet rays is formed.

The photochemical vapor deposition apparatus of an inner discharge type according to this invention can achieve the formation of a vapor-deposited film with extremely high efficiency, because the quantity of ultraviolet rays applied onto the substrate is increased.

The principle and construction of this invention will be clearly understood from the following detailed description and appended claims, taken in conjunction with the accompanying drawings.

DETAILED DESCRIPTION OF THE INVENTION AND PREFERRED EMBODIMENTS

The present invention will be concretely described with reference to embodiments shown in the accompanying drawings.

Figure 1:
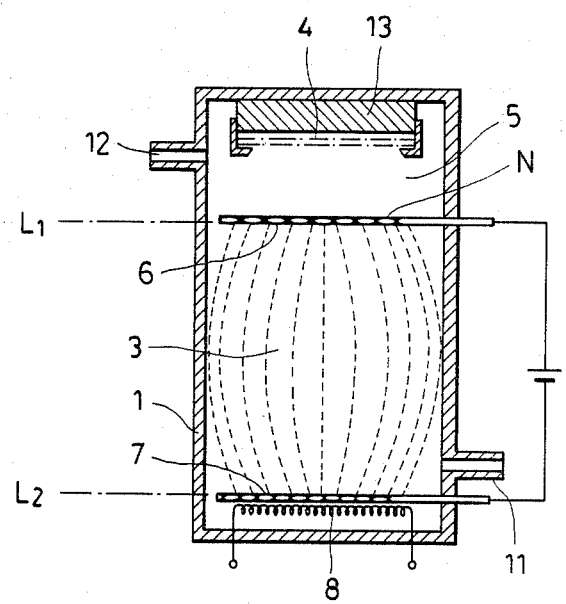
FIG. 1 is a vertical sectional view of a photochemical vapor deposition apparatus in accordance with one embodiment of this invention.
Figure 2:
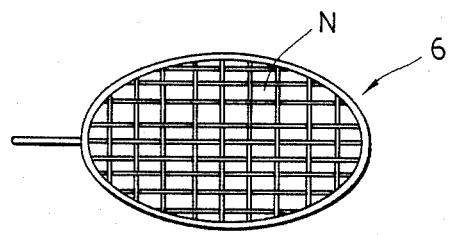
FIG. 2 is a perspective view showing an example of the anode provided in the vapor deposition apparatus of FIG. 1, and FIG. 3 and FIG. 4 are a vertical sectional view and a transverse sectional view of a photochemical vapor deposition apparatus in accordance with another embodiment of this invention, respectively.

FIG. 1 shows the first embodiment of the photochemical vapor deposition apparatus of an inner discharge type according to this invention. In this embodiment, a gas supply port 11 through which a photoreactive gas and a gas for electric discharge are supplied is provided in the lower part of a cylindrical air-tight vessel 1, a gas exhaust port 12 through which these gases are to be exhausted is provided in the upper part thereof, and a substrate support 13 with a heater contained therein is provided at the top part of the vessel 1. A substrate 4 to be subjected to vapor deposition, which is put in and out of the vessel 1 through an opening (not shown) with a shutter therefor, is supported on the lower surface of the substrate support 13, and the space just under the substrate support 13 constitutes a reaction space 5. A discharge space 3 in which plasma discharge will be generated is formed adjacent to and under the reaction space 5, and no partition such as quartz glass or the like is provided between the discharge space 3 and the reaction space 5. An anode 6 is arranged in the first level $L_1$ at which lies a border between the reaction space 5 and the discharge space 3. As shown in FIG. 2, the anode 6 is an electrode consisting of a wire-netting of circular form, made of tungsten for example, having meshes N which are openings through which ultraviolet rays pass. The meshes N of the wire-netting of the anode 6 are relatively rough so as not to obstruct substantially the passage of ultraviolet rays. A cathode 7 is arranged in the second level $L_2$ of the bottom part of the vessel 1. As the cathode 7, there may be used an electrode comprising of one or a plurality of elements which have been generally used up to now for such purposes. In this embodiment, the cathode 7 consists of a wire-netting, made of tungsten for example, like the anode 6, and it has denser meshes than the anode 6. A heater 8 is provided in contact with the lower surface of the cathode 7, and by this heater 8, the heating of the cathode 7 required for emitting electrons is conducted. In order to improve the efficiency of electron emission of the cathode 7, a paste of an electron-emitting substance such as an oxide of alkaline-earth metal may be applied on the cathode 7 in such a manner that the meshes thereof are clogged. Thus, plasma discharge is vertically generated between the anode 6 and the cathode 7, and ultraviolet rays radiated from the plasma are passed through the meshes N of the anode 6 so as to be applied to the substrate 4 supported above.

A concrete example of the vapor deposition using the above-mentioned apparatus will be described. A photochemically reactive gas which was a mixed gas consisting of argon of 5 mmHg as a carrier gas, mercury vapor of $3 \times 10^{-3}$ mmHg as a photosensitizer and silane gas of 1 mmHg as a photoreactive gas for vapor deposition was fed through the gas supply port 11 to flow through the reaction space 5, and a mixed gas for discharging which comprised argon of 8 mmHg and mercury vapor of $2 \times 10^{-3}$ mmHg was supplied into the discharge space 3 with the photoreactive gas. A substrate 4 consisting of an alumina plate was supported on the substrate support 13 and was heated at about 150° C. by the heater. Under such a condition, an electric power with a voltage of 60 V and an amperage of 30 A was applied between the anode 6 and the cathode 7 to generate electric plasma discharge in the discharge space 3, and ultraviolet rays radiated from the plasma of the electric discharge in the gas of argon and mercury were applied to the substrate 4 through the meshes of the anode 6 so that the silane gas was photochemically decomposed and the resultant product was deposited to form an amorphous silicon film on the substrate 4.

In the first embodiment, it is important that in the discharge space 3, the anode 6 and the cathode 7 are arranged respectively, in the first level $L_1$ and the second level $L_2$ different in level from each other in the direction in that the reaction space 5 and the discharge space 3 align, namely in the up-and-down direction in FIG. 1, whereby the plasma discharge is generated in vertical direction. Although the plasma diffuses or expands in the direction perpendicular to the direction of discharging, namely, it diffuses or expands in horizontal direction in FIG. 1 in this case, it can scarcely diffuse over the anode 6 upward into the reaction space 5 where the substrate 4 is placed. Therefore, when a substrate 4 is positioned at a position closer to the discharge space 3, a vapor-deposited film is not damaged by ions or electrons produced in the plasma.

Furthermore, since the anode 6 arranged in the first level $L_1$ that is closer to the discharge space 3 consists of a wire-netting with relatively rough meshes, the radiated ultraviolet rays are not obstructed substantially by the anode 6 and therefore can pass upward through the anode 6 to the substrate 4 with a smaller loss thereof. The larger the thickness of plasma becomes, the more the quantity of ultraviolet rays radiated is increased. In the first embodiment described above, the distance between the anode 6 and the cathode 7 is regarded as the thickness of the plasma, taken from the reaction space 5 where the substrate 4 is placed, because the electric plasma discharge is generated in the vertical direction. In this embodiment, accordingly, it is easy to make the thickness of plasma large so that the quantity of ultraviolet rays radiated toward the substrate 4 increases more than that in the lateral direction, and after all, a large quantity of ultraviolet rays are permitted to be applied onto the substrate 4, as compared with a conventional apparatus in which electric discharge is generated in the horizontal direction. Since it is possible to arrange the substrate 4 at a position closer to the discharge space 3 and it is further possible to increase the quantity of ultraviolet rays to be applied onto the substrate 4, as mentioned above, the quantity of ultraviolet rays effectively applied to the substrate 4 can be widely increased, and as a result, the deposition rate of the vapor-deposited film can be remarkably increased.

In the apparatus of the embodiment illustrated in FIG. 1, the above-mentioned effects can be realized even if the apparatus is set in any position in which another portion thereof is positioned at the top. For example, there may be allowable the following states, namely a state wherein the apparatus of FIG. 1 is turned by an angle of 90° so that the reaction space and the discharge space adjoin each other in the horizontal direction, or a state wherein the apparatus of FIG. 1 is turned by an angle of 180° so that the reaction space is positioned at the lower part of the vessel and the discharge space is adjacent to and above the reaction space. In the case of the state wherein the substrate is placed opposite and below the cathode with the anode interposed, however, there arises the problem that, when the cathode has an electron-emitting substance applied thereon, the electron-emitting substance may possibly peel off and deposit on the vapor-deposited film to contaminate the same. In order to solve this problem, it is effective to use a cathode consisting of a wire-netting of fine meshes and having electron-emitting substance thereon in such a state that the fine meshes are clogged therewith. Since it is desired that the cathode has an excellent electron-emitting ability, an electrode which is made up of a high-melting point metal containing an electron-emitting substance such as thoria or the like is used as the cathode, or an electron-emitting substance is applied to the cathode as in the above-mentioned embodiment. In the latter case, as can be seen from the foregoing, it is required that the cathode be arranged so as not to be positioned directly above the substrate, and otherwise that the electron-emitting substance is applied to the cathode so that the peeling-off thereof does not happen.

Figure 3:
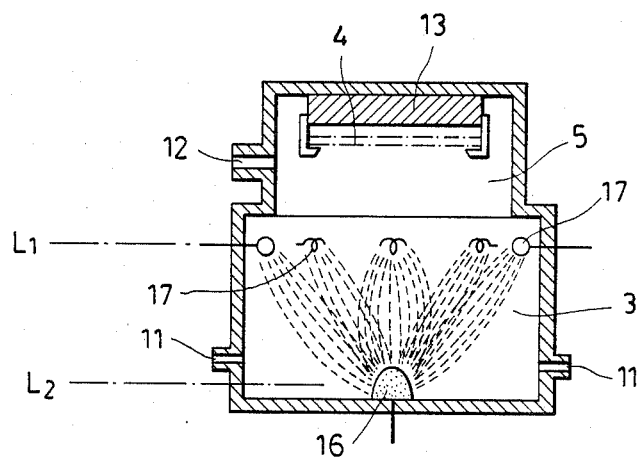
Figure 4:
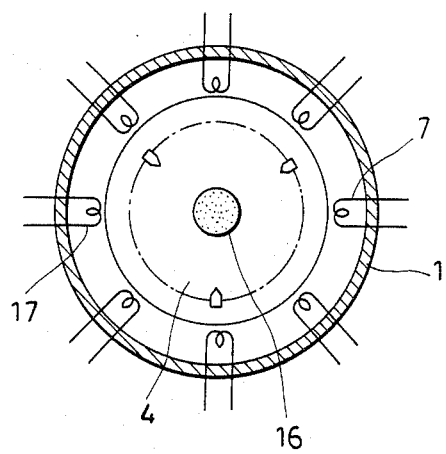

The second embodiment of the photochemical vapor deposition apparatus of inner discharge type according to this invention is illustrated in FIG. 3 and FIG. 4. In this embodiment, the construction of the vessel 1, the gas exhaust port 12 and the substrate support 13 and the relative positions of the discharge space 3 and the reaction space 5 are essentially similar to those of the embodiment shown in FIG. 1, except for the parts elsewhere specified. In this embodiment, a plurality of cathode elements 17 are arranged on the side wall of the vessel 1 in the first level $L_1$, at which lies a border between the discharge space 3 and the reaction space 5, in such a state that, each cathode element is isolated from other cathode elements and arranged along the inner circumference of the vessel 1, and a relatively large hemispherical anode 16 is arranged on the bottom of the vessel 1 in the second level $L_2$ so as to be positioned at the center of the vessel 1. Each of the cathode elements 17 consists of a double coil made by coiling a tungsten wire densely in a coil and further coiling the thus-coiled tungsten wire roughly in a coil, to which double coil a paste of electron-emitting substance such as an oxide of an alkaline-earth metal, for example, is applied to improve its electron emitting ability. A plurality of gas supply ports 11 are provided in the lower part of the vessel 1.

When electric voltage is applied between the anode 16 and the cathode elements 17, plasma discharge is generated in the form of a cone having a vertical axis in accordance with the arrangement of the anode 16 and the cathode elements 17 and ultraviolet rays radiated from the plasma are applied to the substrate 4 supported above the space around which the cathode elements 17 are arranged.

A concrete example of the vapor deposition using the above-mentioned apparatus will be described here. A photochemically reactive gas which was a mixed gas comprising argon of 5 mmHg as a carrier gas, mercury vapor of $3 \times 10^{-3}$ mmHg as a photosensitizer and silane gas of 1 mmHg as a photoreactive gas for vapor deposition was fed through the gas supply ports 11 to flow through the reaction space 5, and a mixed gas for discharging which comprises argon of 8 mmHg and mercury vapor of $2 \times 10^{-3}$ mmHg was supplied into the discharge space 3 with the photoreactive gas. A substrate 4 consisting of an alumina plate was supported and heated at about 150° C. just like as in the first embodiment. Under such a condition, an electric power with a voltage of 60 V and an amperage of 20 A in total was applied between the anode 16 and the cathode elements 17 to generate electric plasma discharge in the discharge space 3, and ultraviolet rays radiated from the plasma of the electric discharge in the gas of argon and mercury were applied to the substrate 4 so that the silane gas was photochemically decomposed and the resultant product was deposited to form an amorphous silicon film on the substrate 4.

In the second embodiment, it is important not only that the cathode elements 17 are arranged in the first level $L_1$ and the anode 16 is arranged in the second level $L_2$, but also that the plurality of the cathode elements 17 are arranged along the inner circumference of the vessel whereby the plasma discharge is generated in the form of a cone having a vertical axis. In a photochemical vapor deposition process utilizing ultraviolet rays, the more the quantity of applied ultraviolet rays is increased, the higher the deposition rate of a vapor-deposited film becomes, and the quantity of ultraviolet rays radiated is increased proportionally to the electric power applied to electrodes. Accordingly, it may be effective to increase the electric power applied to the electrodes in order to make the deposition rate of the vapor-deposited film higher. However, there arises the problem that a cathode may be damaged and degraded considerably when the current density in the cathode is excessive. That is to say, there is a limit to increasing the electric power to be applied. In the second embodiment, since the plurality of the cathode elements 17 are employed, the current density in each of the cathode elements 17 is not excessive and the cathode elements 17 are not damaged even when a large electric power in total is applied thereto so that a large quantity of ultraviolet rays are to be radiated. Accordingly, the deposition rate of the vapor-deposited film may be made higher by increasing the electric power to be applied without any problems.

Since the direction in which the substrate 4 is supported is not a direction perpendicular to the discharging direction in which the plasma diffuses or expands, also in the second embodiment, the vapor-deposited film is not damaged by ions or electrons of the plasma, even when the substrate 4 is kept close to the discharge space 3 in which plasma discharge is generated.

Moreover in the second embodiment, since the thickness of the plasma in the direction in which the reaction space 5 is positioned with respect to the discharge space 3 is nearly equal to the distance between the first level $L_1$ and the second level $L_2$, the plasma has a larger thickness in that direction and a larger quantity of ultraviolet rays are applied to the substrate 4, as compared with a conventional apparatus, and since the ultraviolet rays radiated from the plasma are applied to the substrate 4 through the space surrounded by the cathode elements 17, they are not hindered or obstructed by the cathode elements 17.

In the second embodiment, as mentioned above, there are the following advantages, namely, the ultraviolet rays radiated in the direction in which the thickness of the plasma is larger are to be utilized, the substrate is permitted to be closer to the discharge space and the ultraviolet rays directed to the substrate are not hindered, as in the embodiment shown in FIG. 1. In the second embodiment, furthermore, the deposition rate of a vapor-deposited film can be remarkably increased, because the quantity of ultraviolet rays radiated can be increased by applying a larger electric power to the discharging electrodes without damage thereof and therefore the quantity of the ultraviolet rays effectively applied to the substrate becomes large. In addition, the above-mentioned effects can also be realized in this embodiment, even though the apparatus is set in any state in which any portion thereof is positioned at the top.

Now, a variation of the apparatus according to this invention is described. In the vessel 1, an additional gas supply port may be provided in the reaction space 5 so that the photoreactive gas fed through the additional gas supply port flows through the reaction space only. In such a case, only the gas for discharge is fed through the gas supply port 11 which is provided in the discharge space.

Having now fully described the invention, it will be understood for those skilled in the art that various changes and modifications can be made thereto without departing from the spirit or scope of the invention as set forth herein.

What is claimed is:

1. A photochemical vapor deposition apparatus comprising a vessel defining a reaction space and a discharge space adjacent to and above said reaction space, an anode of wire netting positioned at a first level and a cathode of wire netting having smaller meshes than the anode arranged in a second level, said first level being closer to said reaction space than said second level, and an electron-emitting substance clogging the meshes on said cathode.

2. A photochemical vapor deposition apparatus comprising:
   a vessel defining a reaction space for receiving a substrate for vapor deposition and a discharge space adjacent to said reaction space, in which electric plasma discharge is generated for radiating ultraviolet rays which cause photochemical decomposition reaction of a photoreactive gas; and
   discharging electrodes arranged in the discharge space in a first level and a second level, wherein said discharging electrodes include a plurality of cathode elements positioned in said first level along the inner periphery of the vessel and an anode positioned in said second level, at the center of the vessel.

3. A method for depositing material on a substrate by photochemical vapor deposition comprising the steps of:
   providing an airtight vessel having a reaction space and an adjacent discharge space;
   providing a plurality of spaced discharging electrodes in said discharge space;
   placing the substrate in said reaction space;
   feeding a photoreactive gas into said vessel;
   generating between at least two of said discharging electrodes in a direction generally parallel to a straight line extending between said two discharging electrodes an electric plasma discharge emitting ultraviolet rays; and
   impinging the photoreactive gas with the ultraviolet rays outside the electric plasma discharge to cause a photochemical reaction of said photoreactive gas, wherein the step of placing comprises placing the substrate in said reaction space in a position which is in non-perpendicular relation to said direction of plasma discharge.

4. A method according to claim 3, wherein the step of placing comprises placing the substrate in alignment with said two discharging electrodes so that one of said two discharging electrodes is positioned between the substrate and the other of said two discharging electrodes.

5. A method according to claim 4, wherein the step of generating an electric plasma discharge includes passing said plasma discharge through said one of said two discharging electrodes.

6. A method according to claim 5, wherein the step of providing discharge electrodes includes providing an anode of wire netting as said one of said two discharging electrodes.

7. A method according to claim 6, wherein said discharge space is provided below said reaction space and the step of generating an electric plasma discharge includes applying an electron-emitting substance to said other of said two discharging electrodes.

8. A method according to claim 6, wherein said discharge space is provided above said reaction space, a cathode of wire netting is provided as said other of said two discharging electrodes, and the step of generating an electric plasma discharge includes clogging the wire netting of said cathode with an electron-emitting substance.

9. A method according to claim 3, wherein the step of providing discharging electrodes includes providing a plurality of cathode elements along an inner periphery of said airtight vessel at a first level, and an anode at the center of said airtight vessel at a second level.

10. A method according to claim 9 wherein said discharge space is provided below said reaction space.

* * * * *